United States Patent
Matsuda et al.

(10) Patent No.: US 8,480,912 B2
(45) Date of Patent: Jul. 9, 2013

(54) PLASMA PROCESSING APPARATUS AND PLASMA PROCESSING METHOD

(75) Inventors: Ryuichi Matsuda, Takasago (JP); Masahiko Inoue, Kobe (JP); Kazuto Yoshida, Kobe (JP); Tadashi Shimazu, Kobe (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 1092 days.

(21) Appl. No.: 12/065,373

(22) PCT Filed: Feb. 15, 2007

(86) PCT No.: PCT/JP2007/052747
§ 371 (c)(1),
(2), (4) Date: Jan. 8, 2009

(87) PCT Pub. No.: WO2007/094416
PCT Pub. Date: Aug. 23, 2007

(65) Prior Publication Data
US 2009/0127227 A1    May 21, 2009

(30) Foreign Application Priority Data
Feb. 17, 2006    (JP) .................... 2006-040135

(51) Int. Cl.
*B44C 1/22*    (2006.01)
*B05C 11/00*    (2006.01)
*C23F 1/08*    (2006.01)
*B01J 19/08*    (2006.01)

(52) U.S. Cl.
USPC ......... 216/67; 118/663; 427/569; 156/345.26

(58) Field of Classification Search
None
See application file for complete search history.

(56) References Cited

U.S. PATENT DOCUMENTS

| | | | | | |
|---|---|---|---|---|---|
| 4,483,651 | A | * | 11/1984 | Nakane et al. | 414/217 |
| 5,102,496 | A | * | 4/1992 | Savas | 216/69 |
| 5,163,458 | A | * | 11/1992 | Monroe | 134/1 |
| 5,420,044 | A | * | 5/1995 | Kozuka | 438/485 |

(Continued)

FOREIGN PATENT DOCUMENTS

| | | |
|---|---|---|
| EP | 0419930 A2 | 4/1991 |
| JP | 61-27633 A | 2/1986 |

(Continued)

OTHER PUBLICATIONS

International Search Report of PCT/JP2007/052747, date of mailing May 22, 2007.

(Continued)

*Primary Examiner* — Allan Olsen
(74) *Attorney, Agent, or Firm* — Westerman, Hattori, Daniels & Adrian, LLP

(57) ABSTRACT

Provided are a plasma processing apparatus and a plasma processing method, by which plasma damage is reduced during processing. At the time of performing desired plasma processing to a substrate (5), a process chamber (2) is supplied with an inert gas for carrying in and out the substrate (5), pressure fluctuation in the process chamber (2) is adjusted to be within a prescribed range, and plasma (20) of the inert gas supplied in the process chamber (2) is generated. The density of the plasma (20) in the transfer area of the substrate (5) is reduced by controlling plasma power to be in a prescribed range, and the substrate (5) is carried in and out to and from a supporting table (4).

3 Claims, 5 Drawing Sheets

U.S. PATENT DOCUMENTS

| | | | | |
|---|---|---|---|---|
| 5,685,949 | A * | 11/1997 | Yashima | 438/694 |
| 5,919,332 | A * | 7/1999 | Koshiishi et al. | 156/345.47 |
| 5,935,334 | A | 8/1999 | Fong et al. | |
| 6,433,297 | B1 * | 8/2002 | Kojima et al. | 219/121.43 |
| 6,451,647 | B1 * | 9/2002 | Yang et al. | 438/240 |
| 6,620,298 | B1 * | 9/2003 | Hayata | 204/192.12 |
| 6,685,422 | B2 | 2/2004 | Sundar et al. | |
| 7,144,822 | B1 * | 12/2006 | Kilgore | 438/758 |
| 2001/0048981 | A1 * | 12/2001 | Suzuki | 427/569 |
| 2002/0076939 | A1 | 6/2002 | Li et al. | |
| 2004/0108301 | A1 * | 6/2004 | Hao et al. | 216/71 |
| 2004/0217086 | A1 * | 11/2004 | Kawashima | 216/41 |
| 2005/0022840 | A1 * | 2/2005 | Kobayashi | 134/1.3 |
| 2005/0162805 | A1 * | 7/2005 | Hirose | 361/234 |
| 2005/0205208 | A1 | 9/2005 | Sagae et al. | |
| 2005/0224337 | A1 | 10/2005 | Iwasaki et al. | |
| 2007/0131652 | A1 * | 6/2007 | Okune et al. | 216/67 |
| 2007/0183868 | A1 * | 8/2007 | Son | 414/217 |
| 2008/0182417 | A1 * | 7/2008 | Collins et al. | 438/710 |
| 2009/0023303 | A1 * | 1/2009 | Kobayashi | 438/800 |

FOREIGN PATENT DOCUMENTS

| | | |
|---|---|---|
| JP | 3-197682 A | 8/1991 |
| JP | 2001-156051 A | 6/2001 |
| JP | 2001-335938 A | 12/2001 |
| JP | 2004-154654 A | 6/2004 |
| JP | 2005-44938 A | 2/2005 |
| JP | 2005-236138 A | 9/2005 |
| JP | 2005-302875 A | 10/2005 |

OTHER PUBLICATIONS

Japanese Office Action dated Decemeber 7, 2010, issued in corresponding Japanese Patent Application No. 2006-040135.

Supplementary European Search Report dated May 7, 2010 for corresponding European Patent Application No. 07714277.6.

U.S. Office Action dated Apr. 15, 2013, issued in related U.S. Appl. No. 13/644,999.

* cited by examiner

PLASMA PROCESSING APPARATUS AND PLASMA PROCESSING METHOD

TECHNICAL FIELD

The present invention relates to a plasma processing apparatus and a plasma processing method for performing a plasma process on a substrate or the like by using plasma of a predetermined gas.

BACKGROUND ART

Substrates such as a semiconductor substrate or a glass substrate for a FPD (flat panel display) are subjected to film deposition and etching processes and the like by use of a plasma processing apparatus that generates plasma of a predetermined gas.
Patent Document 1: JP-A 2001-156051

DISCLOSURE OF THE INVENTION

Problem to be Solved by the Invention

While the plasma processing apparatus processes a semiconductor substrate or a glass substrate for a FPD through film deposition and etching processes and the like by using a predetermined gas transformed into plasma, there has been pointed out a problem that a device fabricated on the substrate is damaged by the plasma during the processes (Patent Document 1).

The present invention has been made in view of the foregoing problem and has an object to provide a plasma processing apparatus and a plasma processing method capable of reducing plasma damage during processes.

Means for Solving the Problem

A plasma processing apparatus according to a first present invention for solving the problem includes a process container, pressure adjusting means, transferring means, gas supplying means, plasma generating means, and controlling means. The process container houses a supporting table for placing a substrate. The pressure adjusting means adjusts pressure inside the process container. The transferring means transfers the substrate onto and from the supporting table. The gas supplying means supplies a desired gas to the process container. The plasma generating means generates plasma from the gas supplied to the process container. The controlling means controls the pressure controlling means, the transferring means, the gas supplying means, and the plasma generating means. When the substrate is transferred onto and from the supporting table in order to process the substrate through a desired plasma process, the controlling means performs a control such that: the gas supplying means supplies an inert gas to the process container; the pressure controlling means adjusts pressure fluctuation inside the process container within a predetermined range; the plasma generating means generates the plasma in advance; plasma density in a transfer area for the substrate is set low by controlling plasma power in a plasma generation area above the substrate within a range from 2 kW to 4 kW inclusive; and the transferring means transfers the substrate onto and from the supporting table through the area of the plasma having the low plasma density.

A plasma processing apparatus according to a second present invention for solving the problem includes a process container, pressure adjusting means, transferring means, gas supplying means, plasma generating means, and controlling means. The process container houses a supporting table for placing a substrate. The pressure adjusting means adjusts pressure inside the process container. The transferring means transfers the substrate onto and from the supporting table. The gas supplying means supplies a desired gas to the process container. The plasma generating means generates plasma from the gas supplied to the process container. The controlling means controls the pressure controlling means, the transferring means, the gas supplying means, and the plasma generating means. When the substrate is transferred onto and from the supporting table in order to process the substrate through a desired plasma process, the controlling means performs a control such that: the gas supplying means supplies an inert gas to the process container; the pressure controlling means adjusts pressure fluctuation inside the process container within a predetermined range where mean free path between gas molecules is shorter than a distance for changing plasma density by one digit; the plasma generating means generates the plasma in advance in an area away from a transfer area for the substrate; and the transferring means transfers the substrate onto and from the supporting table while separating an area of the plasma from the transfer area for the substrate.

A plasma processing apparatus according to a third present invention for solving the problem includes a process container, lifting means, pressure adjusting means, transferring means, gas supplying means, plasma generating means, and controlling means. The process container houses a supporting table for placing a substrate. The lifting means lifts the supporting table up and down. The pressure adjusting means adjusts pressure inside the process container. The transferring means transfers the substrate onto and from the supporting table. The gas supplying means supplies a desired gas to the process container. The plasma generating means generates plasma from the gas supplied to the process container. The controlling means controls the lifting means, the pressure controlling means, the transferring means, the gas supplying means, and the plasma generating means. When the substrate is transferred onto and from the supporting table in order to process the substrate through a desired plasma process, the controlling means performs a control such that: the gas supplying means supplies an inert gas to the process container; the pressure controlling means adjusts pressure fluctuation inside the process container within a predetermined range; the plasma generating means generates the plasma in advance; the lifting means lifts the supporting table down so as to set a distance for changing plasma density by one digit longer than mean free path between gas molecules between the substrate placed on the supporting table and a ceiling portion of the process container; and the transferring means transfers the substrate onto and from the supporting table while separating an area of the plasma from the transfer area for the substrate.

A plasma processing apparatus according to a fourth present invention for solving the problem provides the plasma processing apparatus according to any of the first to third present inventions, in which the transferring means includes a hand unit for placing the substrate on an upper surface thereof, and a driving unit for moving the hand unit. The hand unit is made of a conductive material, with a larger size than an outside diameter of the substrate, and fitted to the driving unit with an insulating member made of an insulative material placed in between.

A plasma processing apparatus according to a fifth present invention for solving the problem includes a process container, pressure adjusting means, transferring means, gas supplying means, plasma generating means, and controlling means. The process container houses a supporting table for placing a substrate. The pressure adjusting means adjusts pressure inside the process container. The transferring means transfers the substrate onto and from the supporting table, and includes a hand unit and a driving unit. The hand unit places the substrate on the upper surface thereof, made of a conductive material, and with a larger size than an outside diameter of the substrate. The driving unit supports and moves the hand unit with an insulating member made of an insulative material placed in between. The gas supplying means supplies a desired gas to the process container. The plasma generating means generates plasma from the gas supplied to the process container. The controlling means controls the pressure controlling means, the transferring means, the gas supplying means, and the plasma generating means. When the substrate is transferred onto and from the supporting table in order to process the substrate through a desired plasma process, the controlling means performs a control such that: the gas supplying means supplies an inert gas to the process container; the pressure controlling means adjusts pressure fluctuation inside the process container within a predetermined range; the plasma generating means generates the plasma in advance; and the transferring means transfers the substrate onto and from the supporting table while placing the substrate on the hand unit.

A plasma processing method according to a sixth present invention for solving the problem includes: placing a substrate on a supporting table inside a process container; supplying a desired gas to the process container; adjusting an inside of the process container to a desired pressure; generating plasma from the gas supplied to the process container; and performing a desired plasma process. When the substrate is transferred in order to process the substrate through the desired plasma process, the substrate is transferred onto and from the supporting table under conditions in which: an inert gas is supplied to the process container; pressure fluctuation inside the process container is adjusted within a predetermined range; that the plasma is generated in advance; and thereby plasma density in a transfer area for the substrate is set low.

A plasma processing method according to a seventh present invention for solving the problem provides the plasma processing method according to the sixth present invention, in which the plasma density in the transfer area for the substrate is set low by controlling plasma power in a plasma generation area above the substrate within a range from 2 kW to 4 kW inclusive.

A plasma processing method according to an eighth present invention for solving the problem provides the plasma processing method according to the sixth present invention, in which the plasma density in the transfer area for the substrate is set low by generating the plasma in advance, in a small area away from the transfer area for the substrate under a pressure where mean free path between gas molecules is shorter than a distance for changing plasma density a factor of ten.

A plasma processing method according to a ninth present invention for solving the problem provides the plasma processing method according to the sixth present invention, in which the plasma density in the transfer area for the substrate is set low by moving the supporting table down so as to set a distance for changing plasma density a factor of ten longer than mean free path between gas molecules between the substrate placed on the supporting table, and a ceiling portion of the process container, and by making a position of the supporting table away from the plasma.

A plasma processing method according to a tenth present invention for solving the problem provides the plasma processing method according to any one of the sixth to ninth present inventions, in which the substrate is transferred by use of a hand unit made of a conductive material with a larger size than an outside diameter of the substrate, and set ungrounded by use of an insulating member made of an insulative material.

A plasma processing method according to an eleventh present invention for solving the problem includes: placing a substrate on a supporting table inside a process container; supplying a desired gas to the process container; adjusting an inside of the process container to a desired pressure; generating plasma from the gas supplied to the process container; and performing a desired plasma process. When t the substrate is transferred in order to process the substrate through the desired plasma process, the substrate is transferred onto and from the supporting table by a hand unit having a larger size than an outside diameter of the substrate and set ungrounded by use of an insulating member made of an insulative material, under conditions in which: an inert gas is supplied to the process container; pressure fluctuation inside the process container is adjusted within a predetermined range; and the plasma is generated in advance.

EFFECTS OF THE INVENTION

According to the present invention, the plasma is generated in advance at the time of transferring a substrate onto and from the supporting table inside the process container. Therefore, the plasma need not be ignited every time of transfer of the substrate and transitional changes of the plasma density do not occur at the time of plasma ignition. Hence is it possible to suppress plasma damage on a device on the substrate. Moreover, the plasma density in the transfer area is reduced by reducing the power of the plasma thereof, reducing the plasma area thereof, or making the transfer area away from the plasma area. Accordingly, at the time of transferring the substrate into the process container, it is possible to reduce a potential difference between a portion exposed to the plasma and a portion not exposed thereto, and to further suppress the plasma damage on the device on the substrate.

Meanwhile, according to the present invention, at the time of transferring the supporting table into the process container, the substrate is transferred by use of the hand unit which is made ungrounded by use of the insulating member made of the insulative material and which is made of the conductive material with a size larger than the outside diameter of the substrate. Therefore, it is possible to reduce the potential difference between the portion exposed to the plasma and the portion not exposed thereto by use of the hand unit made of the conductive material, and to further suppress the plasma damage on the device on the substrate.

EXPLANATION OF REFERENCE NUMERALS

1 VACUUM CHAMBER
2 FILM DEPOSITION CHAMBER
3 CEILING PLATE
4 SUPPORTING TABLE
5 SUBSTRATE
6 THIN FILM
7 RADIO FREQUENCY ANTENNA
8 MATCHING BOX
9 RADIO FREQUENCY POWER SOURCE
10a GAS NOZZLE
10b GAS NOZZLE
11 LIFTING DEVICE
12 RADIO FREQUENCY BIAS ELECTRODE
13 MATCHING BOX
14 RADIO FREQUENCY BIAS POWER SOURCE
15 TRANSFER CHAMBER
16 TRANSFER DEVICE
17 HAND UNIT
17A HAND UNIT
17a FORK UNIT
17b INSULATING MEMBER
17c DRIVING UNIT
18 GATE DOOR
19 SUPPORTING PIN
20 PLASMA AREA
21 PLASMA AREA
22 PLASMA AREA
30 TRANSFER PORT
31 PRESSURE CONTROL VALVE
32 EXHAUST DEVICE
33 PRESSURE CONTROL VALVE
34 EXHAUST DEVICE

BEST MODES FOR CARRYING OUT THE INVENTION

Damage caused by plasma during a process can probably attribute a potential difference on a wafer attributed to plasma density distribution, and a transitional change of plasma density at the time of plasma ignition is considered as one of major factors thereof. Therefore, the present invention intends to suppress the plasma damage during the process by igniting the plasma in advance at the time of transferring a substrate and reducing the plasma density in a transfer area.

Now, some embodiments of a plasma processing apparatus and a plasma processing method according to the present invention will be described below in detail with reference to FIGS. 1 to 5.

Embodiment 1

Figure 1:
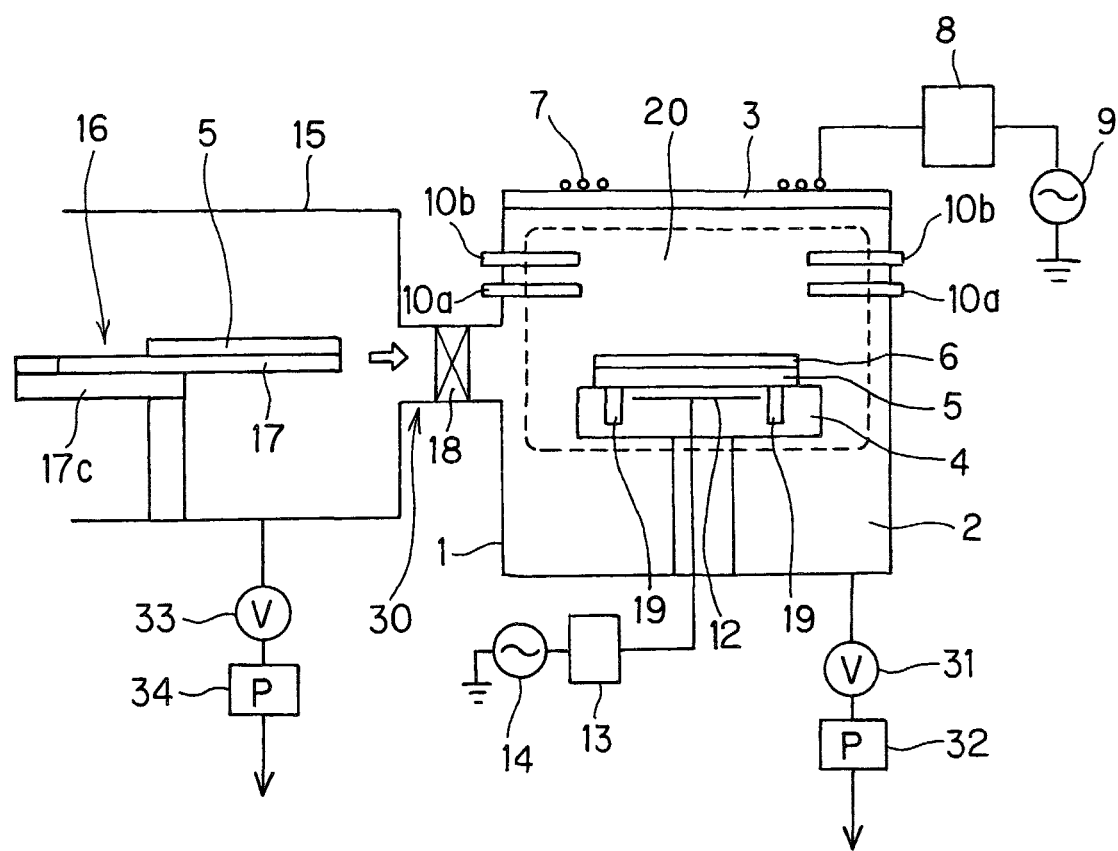
FIG. 1 is a block diagram showing an example of an embodiment of a plasma processing apparatus according to the present invention.

FIG. 1 is a schematic block diagram showing an example of an embodiment of a plasma processing apparatus according to the present invention.

As shown in FIG. 1, the plasma processing apparatus according to the present invention includes a cylindrical vacuum chamber 1 (a process container) inside of which is configured as a process chamber 2. On an upper opening of the vacuum chamber 1, a disc-shaped ceramic ceiling plate 3 is disposed so as to occlude the opening. Multiple radio frequency antennas 7 in circular ring shapes, for example, are disposed on this ceiling plate 3 and a radio frequency (RF) power source 9 is connected to the radio frequency antennas 7 through a matching box (plasma generating means). By supplying electric power to these radio frequency antennas 7, electromagnetic waves are incident on the process chamber 2 through the ceiling plate 3 by supplying electric power to these radio frequency antennas 7, whereby a gas supplied to the process chamber 2 is formed into plasma.

A supporting table 4 is placed at a lower part in the vacuum chamber 1 and a substrate 5 of a semiconductor or the like is placed on the upper surface of the supporting table 4. The supporting table 4 for supporting the substrate 5 is provided with a radio frequency bias electrode 12 and a radio frequency bias power source 14 is connected to the radio frequency bias electrode 12 through a matching box 13. The radio frequency bias power source can apply bias electric power to the substrate 5 through the radio frequency bias electrode 12.

The vacuum chamber 1 is provided with multiple gas nozzles 10a and 10b (gas supplying means) for supplying a desired gas (inert gas such as Ar or $N_2$ or material gas necessary for film deposition or etching, for example) to the process chamber 2. Moreover, the inside of the process chamber 2 is controlled to a desired pressure by a pressure control valve 31 (pressure adjusting means) and is evacuated by an exhaust device. The gas supplied to the process chamber 2 through the gas nozzles 10a and 10b and controlled to the desired pressure is ionized by the electromagnetic waves incident on the process chamber 2 through the ceiling plate 3 and is transformed into a plasma state (plasma 20). Deposition of a thin film 6 by CVD (chemical vapor deposition) and the like or etching of the thin film 6 on the substrate 5 is carried out by causing this plasma 20 to act on the substrate 5.

The vacuum chamber 1 is connected to a transfer chamber 15 through a transfer port 30, and the substrate 5 is transferred in and out between this transfer chamber 15 and the vacuum chamber 1. A transfer device 16 (transferring means) for transferring the substrate 5 is disposed inside the transfer chamber 15, which moves a hand unit 17 for holding the substrate 5 into the vacuum chamber 1 by use of a driving unit 17c and is thereby able to place the substrate 5 on the hand unit 17 onto the supporting table 4.

To be more precise, the transfer port 30 is provided with a gate door 18 for segregating the vacuum chamber 1 from the transfer chamber 15. When the hand unit 17 moves into the vacuum chamber 1, the gate door 18 is opened and then the hand unit moves into the vacuum chamber 1. Thereafter, when the substrate 5 held by the hand unit 17 reaches a predetermined position on the supporting table 4, supporting pins 19 located inside the supporting table 4 move upward to lift up the substrate 5 from the hand unit 17. Then, when the hand unit 17 is pulled back from the vacuum chamber 1, only the substrate 5 is left on the supporting pins 19. Thereafter, the substrate 5 is placed on the supporting table 4 when the supporting pins 19 move downward. Here, the inside of the transfer chamber 15 is also controlled to a desired pressure by use of a pressure control valve 33 and is evacuated by an exhaust valve 34.

In the plasma processing apparatus of this embodiment, a potential difference on the substrate 5 is contrived to be prevented from occurring by improvements to defend an influence of plasma density distribution in transferring the substrate 5 by controlling the respective units and the like with controlling means (not shown), thereby protecting a device on the substrate 5 against plasma damage.

To be more precise, the plasma 20 is generated in the process chamber 2 in advance by use of an inert gas (such as Ar or $N_2$) that does not contribute to film deposition. Moreover, openings of the pressure adjustment valves 31 and 33 are adjusted so as not to cause pressure fluctuation inside the vacuum chamber 1 (the process chamber 2) when opening the gate door 18. In this way, a transitional change in the plasma density is prevented. Moreover, the substrate 5 is transferred to the supporting table 4 while making the plasma density, plasma temperature, and electron density of the plasma 20 sufficiently low by suppressing plasma power to a relatively low level. That is, when the substrate 5 is transferred, ignition of the plasma 20 is avoided and the substrate 5 is transferred in the plasma 20 in a state where its plasma density is sufficiently low.

The plasma power in a plasma generation area above the substrate at the time of transferring the substrate 5 should preferably be set in a range from 2 kW to 4 kW inclusive. This upper limit value 4 kW represents the power of the plasma having the plasma density distribution which does not cause a potential difference of not less than 12 V on the substrate 5. This upper limit value also represents the power of the plasma which does not cause the plasma damage on the device on the substrate 5. Moreover this upper limit value also represents a value not more than the plasma power at the time of film forming/etching processes. Meanwhile, this lower limit value 2 kW represents the plasma power having a difference from the plasma power at the time of the film forming/etching processes, the difference not leading to a large temperature difference in the vacuum chamber 1 itself, that is, the plasma power having the plasma power difference that leads to a temperature difference small enough to generate only an allowable amount of or less particles.

Meanwhile, in order to achieve the plasma density distribution not causing the plasma damage, it is desirable to consider an area corresponding to the size of the substrate as a volume of the plasma generation area which is generated by application of the above-described plasma power. For example, suppose the case where the substrate has a diameter of 8 inches (about 200 mm). In this case, if the volume of the area of a space above the substrate is large enough to entirely cover the substrate (such as a size of approximately twice as large as the diameter) and has a length in a vertical direction (about 167 mm) as will be described later in Embodiment 3, then the volume of the space becomes approximately equal to 20 liters. Alternately, suppose the case where the substrate has a diameter of 12 inches (about 300 mm). In this case, if the volume of the area of the space above the substrate is large enough to entirely cover the substrate (such as a size of approximately twice as large as the diameter) and has the length in the vertical direction (about 167 mm) as will be described later in Embodiment 3, then the volume of the space becomes approximately equal to 40 liters.

A series of control of (1) transferring the substrate 5 in, (2) a plasma process on the substrate 5, and (3) transferring the substrate 5 out will be described as follows.

(1) When transferring the substrate 5 onto the supporting table 4, the plasma 20 is generated inside the process chamber 2 in advance by use of the inert gas and the openings of the pressure adjustment valves 31 and 33 are adjusted so as not to cause the pressure fluctuation inside the vacuum chamber 1 when opening the gate door 18. Hence the substrate 5 is transferred onto the supporting table 4 and the substrate 5 is placed on the supporting table 4.

(2) When the substrate 5 is subjected to desired plasma process, the gate door 18 is closed and then the gas for generating the plasma 20 is replaced with a material gas used for film forming or etching while maintaining the condition where the plasma 20 is generated. Moreover, the pressure and the plasma power in the vacuum chamber 1 are changed into desired values and thereafter the desired plasma process is executed.

(3) When transferring the substrate 5 from the supporting table 4, the gas for generating the plasma 20 is replaced with the inert gas after completion of the plasma process while maintaining the condition where the plasma 20 is generated. Moreover, the openings of the pressure control valves 31 and 33 are adjusted so as to eliminate the pressure fluctuation inside the vacuum chamber 1 when opening the gate door 18, and then the substrate 5 is transferred from the supporting table 4.

As described above, the plasma is not ignited every time of transfer of the substrate 5 and the substrate 5 is transferred in the plasma 20 with a sufficiently low plasma density. Accordingly, it is possible to suppress the plasma damage on the device on the substrate 5 without suffering from an influence of the transitional change in the plasma density at the time of the plasma ignition. Moreover, since the plasma 20 made to have the sufficiently low plasma density, it is possible to reduce the potential difference between a portion exposed to the plasma and a portion not exposed thereto and to further suppress the plasma damage on the device on the substrate 5 in transferring the substrate 5. Here, the allowable potential difference is preferably set smaller than capacitor withstand voltage and gate withstand voltage of the device so that the potential difference in the substrate 5 can be not more than 12 V.

Embodiment 2

Figure 2:
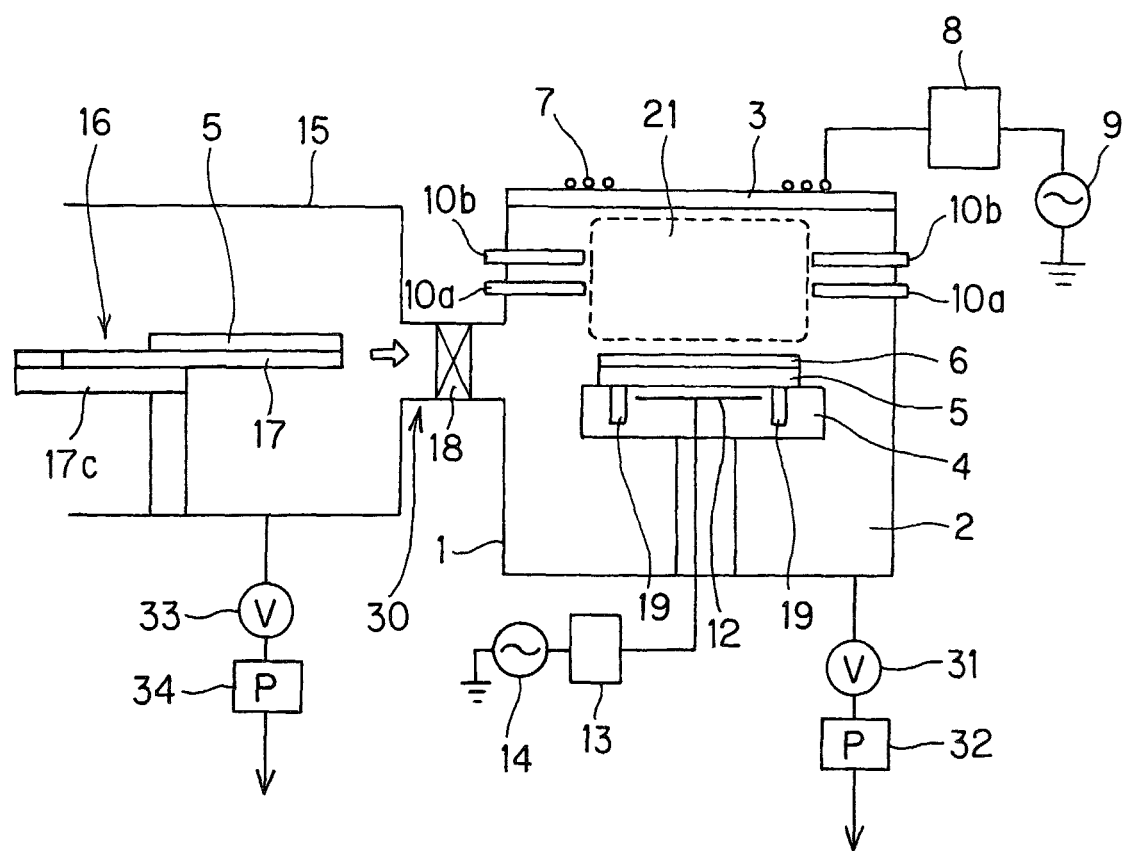
FIG. 2 is a block diagram showing another example of an embodiment of the plasma processing apparatus according to the present invention.

FIG. 2 is a schematic block diagram showing another example of an embodiment of the plasma processing apparatus according to the present invention. As shown in FIG. 2, the plasma processing apparatus of this embodiment is equivalent to the plasma processing apparatus of Embodiment 1 shown in FIG. 1 except a state of plasma 21. Therefore, device configurations similar to those in the plasma processing apparatus shown in FIG. 1 are designated by the same reference numerals and this embodiment will be described mainly based on different sections.

In the plasma processing apparatus of this embodiment, improvements are also achieved to prevent the substrate 5 from being influenced by the plasma density distribution in transferring the substrate 5 by controlling the respective units and the like with the controlling means (not shown).

To be more precise, the plasma 21 is generated in the process chamber 2 in advance by use of the inert gas (such as Ar or $N_2$) that does not contribute to film deposition. Moreover, the openings of the pressure adjustment valves 31 and 33 are adjusted so as not to cause the pressure fluctuation inside the vacuum chamber 1 (the process chamber 2) when opening the gate door 18. In this way, a transitional change in the plasma density is prevented. Moreover, at this time, the pressure inside the vacuum chamber 1 is set to a relatively high state for generating the plasma 21. In the state of the relatively high pressure, the plasma 21 is generated near the antennas 7. Accordingly, the substrate 5 is transferred while making the plasma density in an area for performing transfer of the substrate 5 sufficiently low. That is, when the substrate 5 is transferred, ignition of the plasma 21 is avoided and the substrate 5 is transferred in the plasma 21 with a sufficiently low plasma density.

The relatively high pressure stated herein is equivalent to pressure satisfying so that mean free path between gas molecules becomes not more than 3% of a length in a height direction of the plasma generation area (hereinafter referred to as the height of the plasma generation area) above the substrate. Moreover, 3% of the height of the plasma generation area is a value calculated by obtaining a distance for reducing the plasma density a factor ten, such as a distance for reducing the plasma density in the order of $10^{17}$ pieces per cubic meter to the plasma density in the order of $10^{16}$ pieces per cubic meter where the plasma damage becomes relatively less by means of a plasma analysis, and then by comparing this value with the height of the plasma generation area. Accordingly, it is possible to set the plasma density in the area for performing the transfer of the substrate 5 to the state of the sufficiently low plasma density by means of setting the mean free path between the gas molecules to the state of the relatively high pressure not more than 3% of the height of the plasma generation area, i.e. the state of the relatively high pressure where the mean free path between the gas molecules becomes shorter than the distance of reducing the plasma density a factor of ten.

The series of control of (1) transferring the substrate 5 in, (2) the plasma process on the substrate 5, and (3) transferring the substrate 5 out will be described as follows.

(1) When transferring the substrate 5 onto the supporting table 4, the plasma 21 is generated inside the process chamber 2 in advance in the state of the relatively high pressure by use of the inert gas and the openings of the pressure adjustment valves 31 and 33 are adjusted so as not to cause the pressure fluctuation inside the vacuum chamber 1 when opening the gate door 18. Hence the substrate 5 is transferred onto the supporting table 4 and the substrate 5 is placed on the supporting table 4. At this time, the plasma 21 is generated in the area separated from the transfer area of the substrate 5.

(2) When the substrate 5 is subjected to the desired plasma process, the gate door 18 is closed and then the gas for generating the plasma 21 is replaced with the material gas used for film forming or etching while maintaining the condition where the plasma 21 is generated. Moreover, the pressure and the plasma power inside the vacuum chamber 1 are changed into desired values and the desired plasma process is executed.

(3) When transferring the substrate 5 from the supporting table 4, the gas for generating the plasma 21 is replaced with the inert gas which is controlled in the state of the relatively high pressure after completion of the plasma process while maintaining the condition where the plasma 21 is generated. Moreover, the openings of the pressure control valves 31 and 33 are adjusted so as to eliminate the pressure fluctuation inside the vacuum chamber 1 when opening the gate door 18, and then the substrate 5 is transferred from the supporting table 4. At this time as well, the plasma 21 is generated in the area separated from the transfer area of the substrate 5.

As described above, the plasma is not ignited every time of transfer of the substrate 5 and the substrate 5 is transferred in the plasma 21 with a sufficiently low plasma density in the transfer area of the substrate 5 by generating the plasma 21 away from the transfer area of the substrate 5. Accordingly, it is possible to suppress the plasma damage on the device on the substrate 5 without suffering from an influence of the transitional change in the plasma density at the time of the plasma ignition. Moreover, since the plasma 21 in the moving area of the substrate 5 made to have the sufficiently low plasma density, it is possible to reduce the potential difference between the portion exposed to the plasma and the portion not exposed thereto and to further suppress the plasma damage on the device on the substrate 5 when transferring the substrate 5.

In this embodiment, the pressure inside the vacuum chamber 1 is increased and the area of the plasma 21 is located in a position as remote as possible from the area for moving the substrate 5. Instead, it is also possible to apply a configuration to render positions of the high frequency antennas 7 movable so that the area of the plasma 21 is located in the position as remote as possible from the area for moving the substrate 5 by moving the high frequency antennas 7 to a remote position from the substrate 5, for example. In this case, it is also possible to dispose the high frequency antennas 7 on outer periphery on side surfaces of the vacuum chamber 1 instead of the upper part of the vacuum chamber 1 (the ceiling plate 3) and thereby to change the position to generate the plasma 21.

Embodiment 3

Figure 3:
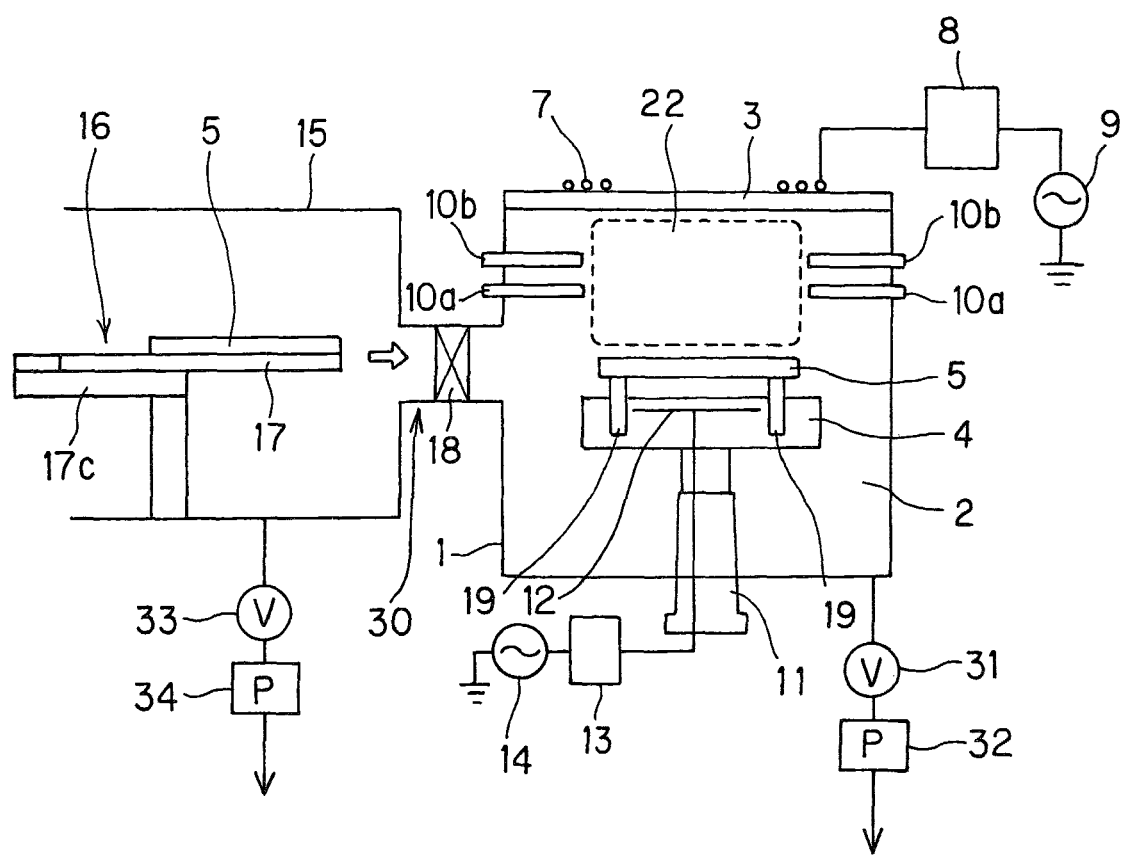
FIG. 3 is a block diagram showing another example of an embodiment of the plasma processing apparatus according to the present invention, which shows a state of transferring a substrate.
Figure 4:
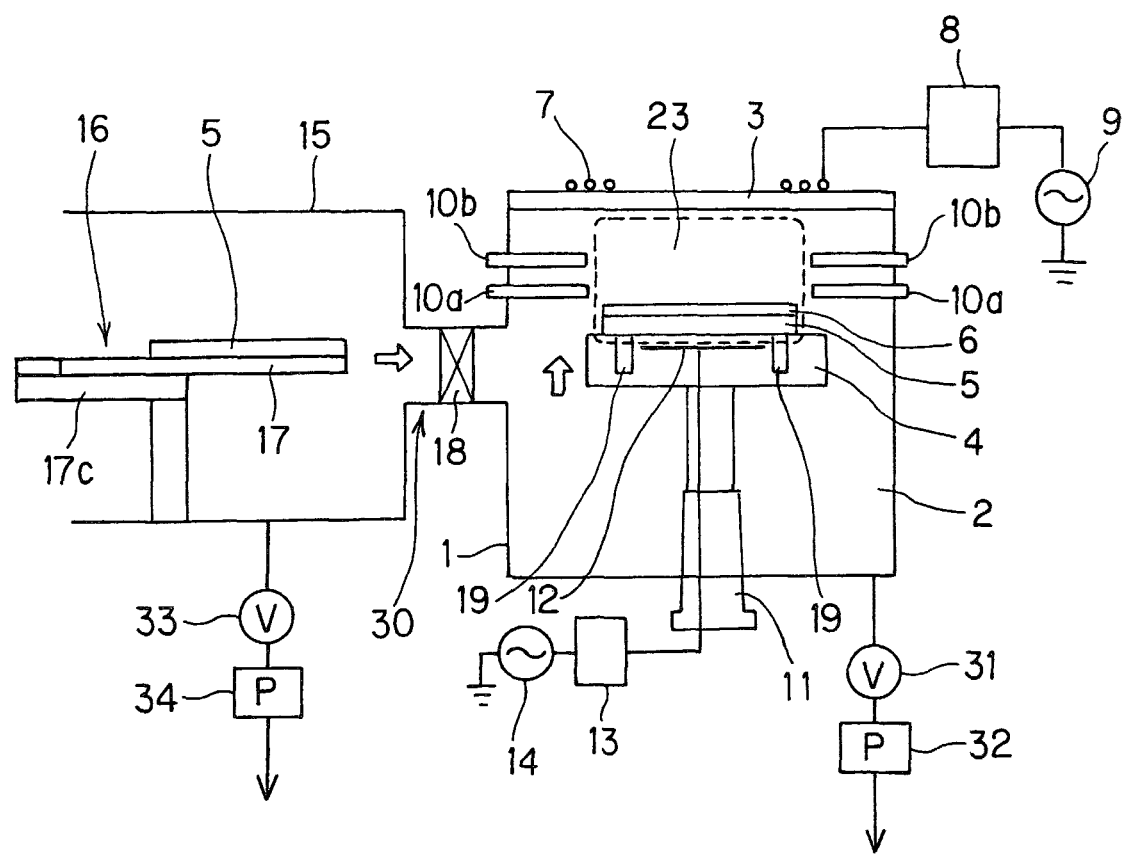
FIG. 4 is a block diagram showing the other example of the embodiment of the plasma processing apparatus according to the present invention, which shows a state of performing a plasma process on the substrate.

FIGS. 3 and 4 are schematic block diagrams showing another example of an embodiment of the plasma processing apparatus according to the present invention. As shown in FIGS. 3 and 4, the plasma processing apparatus of this embodiment is the plasma processing apparatus of Embodiment 1 shown in FIG. 1 or the plasma processing apparatus of Embodiment 2 shown in FIG. 2 provided with a lifting device 11 (lifting means) for lifting the supporting table 4 in the vertical direction. Except that, the apparatus is equivalent to the plasma processing apparatus shown in FIG. 1 or 2. Therefore, device configurations similar to those in the plasma processing apparatuses shown in FIGS. 1 and 2 are designated by the same reference numerals and this embodiment will be described mainly based on different sections.

In the plasma processing apparatus of this embodiment, improvements are also achieved to prevent the substrate 5 from an influence of the plasma density distribution when transferring the substrate 5 by providing the moving device 11 for moving the supporting table 4 in the vertical direction, moving the supporting table 4 down and transferring the substrate in a position away from an area of plasma 22 when transferring the substrate (see FIG. 3), and moving the supporting table 4 up and moving the substrate 5 into the area of the plasma 22 at the time of the plasma process (see FIG. 4).

To be more precise, the plasma 22 is generated inside the process chamber 2 in advance by use of the inert gas (such as Ar or $N_2$) that does not contribute to film deposition. Moreover, the openings of the pressure adjustment valves 31 and 33 are adjusted so as not to cause the pressure fluctuation inside the vacuum chamber 1 (the process chamber 2) when opening the gate door 18. In this way, a transitional change in the plasma density is prevented. Moreover, the supporting table 4 is moved down by the moving device 11 so as to separate the transfer area of the substrate 5 away from the plasma 22, thereby performing the transfer of the substrate 5 while making the plasma density in the transfer area of the substrate the sufficiently low. That is, when the substrate 5 is transferred, the transfer of the substrate 5 is performed in the area having the sufficiently low plasma density while avoiding ignition of the plasma 22 and separating from the area of the plasma 22 in the vertical direction. At this time, it is desirable to set the mean free path between the gas molecules not more than 3% of a distance in the vertical direction between the substrate 5 placed on the supporting table 4 and the ceiling plate 3 above the vacuum chamber 1 (hereinafter referred to as the distance in the vertical direction). As similar to the description in Embodiment 2, this value is calculated by obtaining the distance for reducing the plasma density a factor of ten by means of the plasma analysis and then comparing this value with the distance in the vertical direction. Therefore, a gradient of change of the plasma density may be reduced between the substrate 5 placed on the supporting table 4 and the ceiling plate 3 by moving the supporting table 4 down by use of the moving device 11 so as to render the distance for changing the plasma density a factor ten longer than the mean free path between the gas molecules. For example, in the case of $N_2$ gas, the mean free path is around 5 mm at the time of pressure equal to 10 mTorr. Here, the distance in the vertical direction between the substrate 5 and the ceiling plate 3 for setting this value not more than 3% requires at least some 167 mm.

The series of control of (1) transferring the substrate 5 in, (2) the plasma process on the substrate 5, and (3) transferring the substrate 5 out will be described as follows.

(1) When transferring the substrate 5 onto the supporting table 4, the plasma 22 is generated inside the process chamber 2 in advance by use of the inert gas and the openings of the pressure adjustment valves 31 and 33 are adjusted so as not to cause the pressure fluctuation inside the vacuum chamber 1 when opening the gate door 18. Hence the substrate 5 is transferred onto the supporting table 4 that is moved down by the moving device 11 and the substrate 5 is placed on the supporting table 4. At this time, the transfer area of the substrate 5 is located away from the plasma 22.

(2) When the substrate 5 is subjected to the desired plasma process, the gate door 18 is closed and then the substrate 5 is transferred to the region of the plasma 22 by moving the supporting table 4 upward by use of the moving device 11. Thereafter, the gas for generating the plasma 22 is replaced with the material gas used for film forming or etching while maintaining the condition where the plasma 22 is generated. Moreover, the pressure and the plasma power inside the vacuum chamber 1 are changed into desired values and the desired plasma process is executed.

(3) When transferring the substrate 5 from the supporting table 4, the supporting table 4 is moved downward by use of the moving device 11 and then the gas for generating the plasma 22 is replaced with the inert gas while maintaining the condition where the plasma 22 is generated. Moreover, the openings of the pressure control valves 31 and 33 are adjusted so as to eliminate the pressure fluctuation inside the vacuum chamber 1 when opening the gate door 18, and then the substrate 5 is transferred from the supporting table 4. At this time as well, the transfer area of the substrate 5 is located in a position away from the plasma 22.

As described above, the plasma is not ignited every time of transfer of the substrate 5 and the substrate 5 is transferred while sufficiently reducing the plasma density of the plasma 21 in the transfer area of the substrate 5 by moving the supporting table 4 downward by use of the moving device 11 and thereby separating the transfer area of the substrate 5 from the plasma 22. Accordingly, it is possible to suppress the plasma damage on the device on the substrate 5 without suffering from an influence of the transitional change in the plasma density at the time of the plasma ignition. Moreover, since the plasma 21 in the moving area of the substrate 5 made to have the sufficiently low plasma density, it is possible to reduce the potential difference between the portion exposed to the plasma and the portion not exposed thereto and to further suppress the plasma damage on the device on the substrate 5 when transferring the substrate 5.

Embodiment 4

Figure 5:
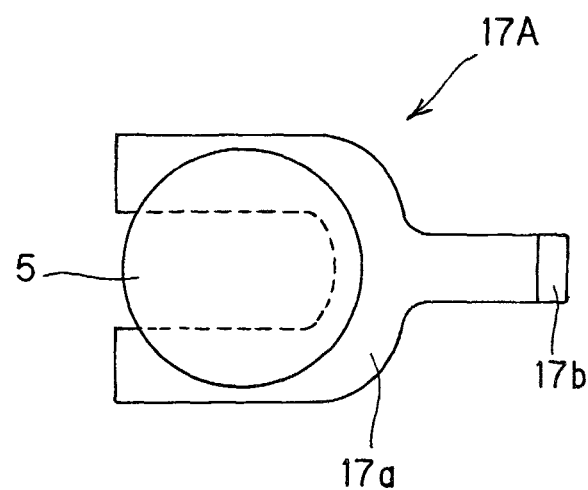
FIG. 5 is a block diagram showing a hand unit of a transfer device used in the plasma processing apparatus according to the present invention.

FIG. 5 is a schematic block diagram showing another example of an embodiment of the plasma processing apparatus according to the present invention, which provides a specific configuration of the hand unit 17 in the plasma processing apparatuses shown in Embodiment 1 (FIG. 1) and the like. Therefore, the configuration of the plasma processing apparatus may be equivalent to the plasma processing apparatuses shown in Embodiment 1 and the like. Accordingly, only a configuration of a hand unit 17A is illustrated herein for describing this embodiment.

In the plasma processing apparatus of this embodiment, a two-way fork unit 17a of the hand unit 17A is made of a material having fine electric conductivity and the size of the fork unit 17a is formed larger than an outside diameter of the substrate 5. Moreover, the fork unit 17a is fitted to the driving unit 17c of the transfer device 16 through an insulating member 17b made of an insulative material. This configuration intends to eliminate the potential difference by use of the fork unit 17a, which is larger than the substrate 5 and has fine electric conductivity, so as not to cause the potential difference between the portion exposed to the plasma and the portion not exposed thereto on the substrate 5.

Moreover, since the fork unit 17a is connected to the driving unit 17c through the insulating member 17b, the fork unit 17a made of a metal material is made ungrounded and does not affect the plasma. Meanwhile, the supporting pins 19 are also made of an insulative material and therefore do not affect the plasma similarly.

Here, as shown in FIG. 5, the fork unit 17a is formed into a fork shape having two-way tip ends, so that the supporting pins 19 are located inside the two-way fork-shape when placing the substrate 5 on the supporting table 4 or picking the substrate 5 up from the supporting table 4. In this way, actions of the fork unit 17a and the supporting pins 19 do not interfere with each other.

When the case of using the hand unit 17A having this configuration is described with reference to the plasma processing apparatus shown in FIG. 1, the plasma 20 is generated inside the process chamber 2 in advance by use of the inert gas (such as Ar or $N_2$) that does not contribute to film deposition. Moreover, the openings of the pressure adjustment valves 31 and 33 are adjusted so as not to cause the pressure fluctuation inside the vacuum chamber 1 (the process chamber 2) when opening the gate door 18. In this way, the transitional change in the plasma density is prevented. Moreover, in the area of the plasma 21, the substrate 5 is transferred by use of the hand unit 17A. That is, when the substrate 5 is transferred, the plasma ignition is avoided and the substrate 5 is transferred by use of the hand unit 17A so that the substrate 5 is hardly affected by the plasma 20.

As described above, the substrate 5 is transferred in the state of not igniting the plasma every time of transfer of the substrate 5. Accordingly, it is possible to suppress the plasma damage on the device on the substrate 5 without suffering from an influence of the transitional change in the plasma density at the time of the plasma ignition. Moreover, since the substrate 5 is rendered hardly affected by the plasma 20 by use of the hand unit 17A made of the conductive material, it is possible to reduce the potential difference between the portion exposed to the plasma and the portion not exposed thereto and to further suppress the plasma damage on the device on the substrate 5 when transferring the substrate 5.

This embodiment can suppress the plasma damage on the device on the substrate 5 by simply generating the plasma in advance. However, it is possible to suppress the plasma damage on the device on the substrate 5 even more effectively by further performing the control to reduce the plasma density itself in the moving area of the substrate 5 as described in Embodiments 1 to 3.

Industrial Applicability

The present invention is applicable to any types of plasma processing apparatuses.

The invention claimed is:

1. A plasma processing method comprising:
transferring a substrate onto and from a supporting table inside a process container;
supplying an inert gas to the process container; and
generating plasma from the gas supplied to the process container in an area away from a transfer area for said transferring of the substrate at a pressure inside the process container in which a mean free path between molecules of the gas is not more than 3% of a length in height direction of a plasma generation area above the substrate.

2. A plasma processing method comprising:
transferring a substrate onto and from a supporting table inside a process container;
supplying an inert gas to the process container;
generating plasma from the gas supplied to the process container; and
moving the supporting table down with a predetermined distance between the substrate placed on the supporting table and a ceiling portion of the process container, the predetermined distance being set so that a mean free path between molecules of the gas is not more than 3% of the predetermined distance in vertical direction between the substrate and the ceiling portion.

3. The plasma processing method according to claim 1 or 2, wherein a potential difference on the substrate which is caused by a distribution of the plasma density is not more than 12V.

* * * * *